(12) United States Patent
Aude

(10) Patent No.: US 6,876,182 B1
(45) Date of Patent: Apr. 5, 2005

(54) MOSFET CURRENT MIRROR CIRCUIT WITH CASCODE OUTPUT

(75) Inventor: Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 78 days.

(21) Appl. No.: 10/374,285

(22) Filed: Feb. 25, 2003

(51) Int. Cl.[7] .............................. G05F 3/17; G05F 3/20
(52) U.S. Cl. ...................... 323/313; 323/312; 323/314
(58) Field of Search ................... 323/313, 314, 323/315, 312

(56) References Cited

U.S. PATENT DOCUMENTS

| | | | |
|---|---|---|---|
| 5,373,228 A | * | 12/1994 | Holle .......................... 323/315 |
| 5,559,425 A | * | 9/1996 | Allman ........................ 323/315 |
| 5,910,749 A | * | 6/1999 | Kimura ........................ 327/541 |
| 5,959,446 A | * | 9/1999 | Kuckreja ..................... 323/315 |
| 6,356,153 B1 | * | 3/2002 | Ivanov et al. ............... 330/253 |
| 6,600,302 B2 | * | 7/2003 | Ghozeil et al. ............. 323/313 |

* cited by examiner

*Primary Examiner*—Bao Q. Vu
(74) *Attorney, Agent, or Firm*—Vedder Price Kaufman & Kammholz, P.C.

(57) ABSTRACT

A metal oxide semiconductor field effect transistor (MOSFET) current mirror circuit with a cascode output in which maximum operating ranges are achieved for the power supply voltage and cascode output biasing voltage. Replica biasing ensures adequate biasing for the cascode driver transistors and accurate current mirroring.

16 Claims, 1 Drawing Sheet

US 6,876,182 B1

MOSFET CURRENT MIRROR CIRCUIT WITH CASCODE OUTPUT

BACKGROUND OF THE INVENTION

1. Field of the Invention

The present invention relates to current mirror circuits, and in particular, to metal oxide semiconductor field effect transistor (MOSFET) current mirror circuits with cascode outputs.

2. Description of the Related Art

Current mirror circuits, in general, are well known in the art and are used in many applications. As is well known, in a conventional current mirror circuit, an input current source drives one of a pair of transistors interconnected in such a manner that such input current is substantially replicated, or mirrored, at the output of the second transistor. Generally, one important factor in designing such a current mirror circuit is matching the input and output currents according to the desired proportion or ratio.

Current mirror circuits found in present day integrated circuits tend to be implemented using MOSFETs. As integrated circuits have become increasingly dense, in terms of transistor count versus die size, channel lengths of the MOSFETs have also become shorter. Such decreased channel lengths result in decreased output impedances for current mirror circuits. Accordingly, it has become increasingly necessary to provide cascode output circuits to increase the output impedances.

Cascode output stages often exhibit limited voltage ranges in terms of possible biasing voltage for the cascode output stage, as well as possible supply voltages. For example, in complementary MOSFET applications requiring a high DC voltage gain, as noted above, a cascode output stage is often implemented. Typically, the bias voltage on the gate of the cascode transistor is a fixed voltage. Similarly, when a differential transistor pair is used, the voltage on the gates of each transistor is also typically a fixed DC common mode voltage. Such fixed voltages limit the drain voltage of the driver transistor for the cascode device.

SUMMARY OF THE INVENTION

In accordance with the presently claimed invention, a metal oxide semiconductor field effect transistor (MOSFET) current mirror circuit has a cascode output and maximum operating ranges for the power supply voltage and cascode output biasing voltage. Replica biasing ensures-adequate biasing for the cascode driver transistors and accurate current mirroring.

In accordance with one embodiment of the presently claimed invention, a metal oxide semiconductor field effect transistor (MOSFET) current mirror circuit with a cascode output includes power supply terminals, current and voltage source circuitry and cascode circuitry. The power supply terminals convey a power supply voltage. The current and voltage source circuitry, coupled between the power supply terminals, responds to a received input current by providing a first bias voltage and a mirrored current proportional to the input current. The cascode circuitry, coupled between the power supply terminals and to the current and voltage source circuitry, responds to a received second bias voltage, the first bias voltage and the mirrored current by providing a cascode current proportional to the mirrored current. The power supply voltage has a magnitude with a minimum approximately equal to a sum of a transistor input biasing voltage and two transistor output operating voltages, and the second bias voltage has a magnitude with a maximum approximately equal to the power supply voltage magnitude and a minimum approximately equal to a sum of another transistor input biasing voltage and another transistor output operating voltage.

In accordance with another embodiment of the presently claimed invention, a metal oxide semiconductor field effect transistor (MOSFET) current mirror circuit with a cascode output includes power supply terminals, current mirror circuitry, voltage source circuitry and cascode circuitry. The power supply terminals convey a power supply voltage. The current mirror circuitry, coupled between the power supply terminals, responds to a received input current and a received first bias voltage by providing a mirrored current proportional to the input current. The voltage source circuitry, coupled between the power supply terminals and to the current mirror circuitry, responds to the received input current by providing the first bias voltage and a second bias voltage. The cascode circuitry, coupled between the power supply terminals, to the current mirror circuitry and to the voltage source circuitry, responds to a received third bias voltage, the second bias voltage and the mirrored current by providing a cascode current proportional to the mirrored current. The power supply voltage has a magnitude with a minimum approximately equal to a sum of a transistor input biasing voltage and two transistor output operating voltages, and the second bias voltage has a magnitude with a maximum approximately equal to the power supply voltage magnitude and a minimum approximately equal to a sum of another transistor input biasing voltage and another transistor output operating voltage.

BRIEF DESCRIPTION OF THE DRAWING

The FIGURE is a schematic circuit diagram for a MOSFET current mirror circuit with a cascode output in accordance with one embodiment with the present invention.

DETAILED DESCRIPTION OF THE INVENTION

Figure 1:
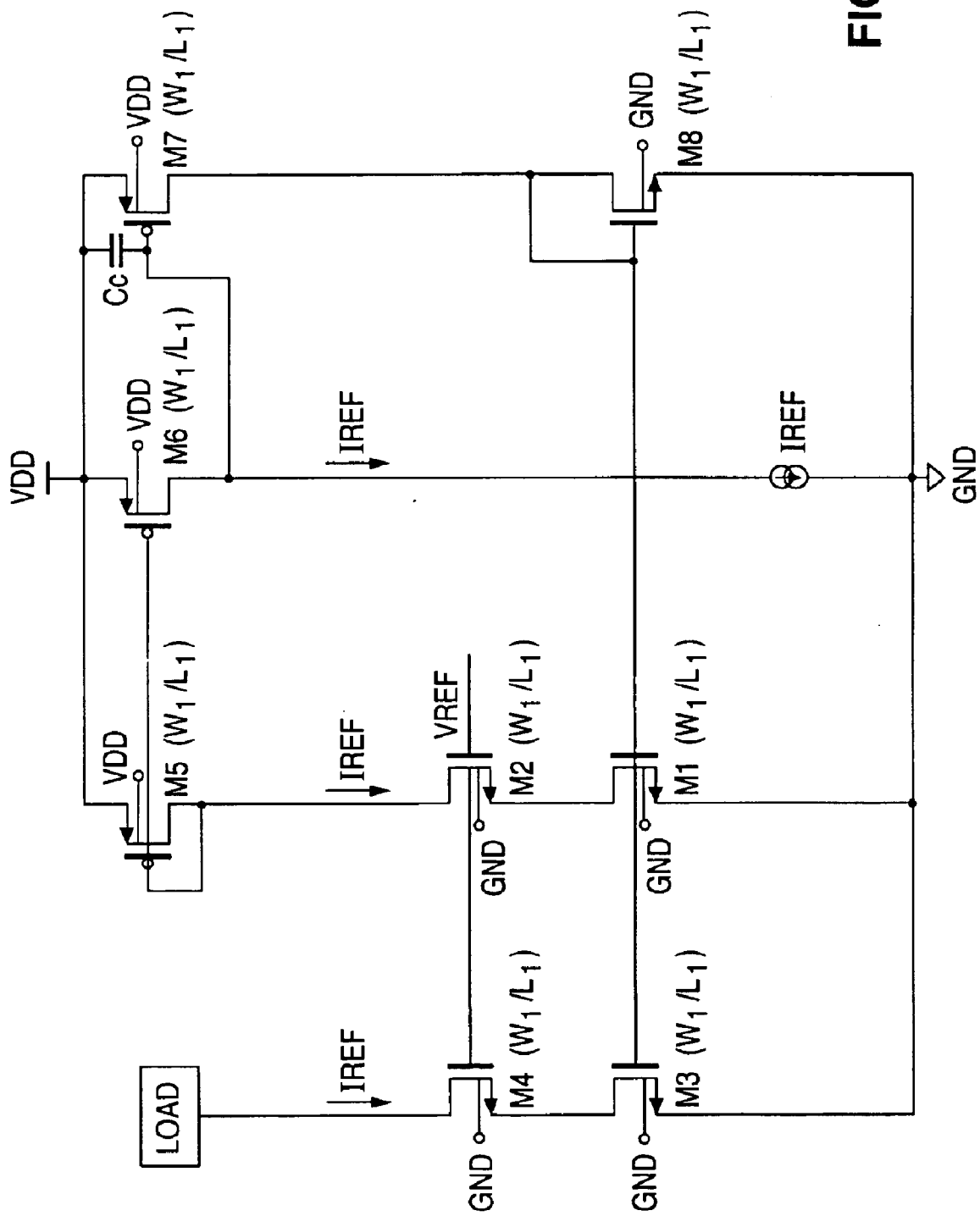

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal.

Referring to the FIGURE, a MOSFET current mirror circuit with a cascode output in accordance with one embodiment of the present invention includes N-type MOSFETs (N-MOSFETs) M1, M2, M3, M4, M8 and P-type MOSFETs (P-MOSFETs) M5, M6, M7, all interconnected substantially as shown. In this particular example, these transistors M1–M8 each have equal channel width W1 and length L1 dimensions, and, therefore, have equal channel width-to-length ratios W1/L1. Transistors M5 and M6 form a current mirror circuit with a current source IREF providing the input current IREF to the drain terminal of transistor M6. In accordance with conventional current mirror principles, this input current IREF is replicated, or mirrored, as an equal current IREF through transistors M5, M2, and M1. It will be appreciated and understood that these currents are equal due to the equal channel width and length dimensions of the transistors, as noted above, and that such mirrored current can have other values proportional to the input current IREF in conformance with different ratios of channel and length dimensions of the current mirror transistors M6 and M5. Transistors M7 and M8 serve as a voltage biasing circuit to provide voltage biasing for transistor M6 and transistor M1 (discussed in more detail below).

The bias voltages appearing at the gate terminals at transistor M7 and M8 vary in mutually opposing directions thereby providing negative feedback between the drain terminal of transistor M6 and the drain terminal of transistor M5 (via transistors M1 and M2). Accurate current mirror operation on the part of transistors M6 and M5 is ensured by matching the bias conditions for transistors M5 and M6 such that their respective gate-to-source VGS and drain-to-source VDS voltages match. Transistor M7, by virtue of its source-to-gate connection between the power supply voltage VDD terminal and the drain terminal of transistor M6, establishes the drain-to-source voltage VDS of transistor M6 at the gate-to-source voltage VGS of transistor M7. Meanwhile, transistor M5, being diode-connected also has a drain-to-source voltage VDS equal to its gate-to-source voltage VGS. Hence, transistors M5 and M6 each have drain-to-source voltages VDS equal to a gate-to-source voltage VGS, thereby ensuring accurate mirroring of the input current to transistor M6 by output transistor M5 (in conformance with their respective transistor channel dimensions).

The driver transistors M1, M3 of the cascode output stage are both driven at their gate terminals by the bias voltage provided at the gate terminal of transistor M8. The gate terminals of the cascode devices, transistors M2 and M4, are similarly driven by another biasing voltage VREF (provided by an external source which is not shown). Accordingly, the mirrored current IREF provided to transistors M2 and M1 is further replicated as an equal output current IREF via transistors M3 and M4 for sinking from a load circuit.

The feedback loop in this circuit has one high impedance node at the gate terminal of transistor M7. Accordingly, such circuit can be designed such that any coupling capacitance Cc between the gate and source terminals of transistor M7 can be designed to be zero (other than any normal parasitic capacitance that may exist). However, in the event that additional circuit stability is necessary, some finite amount of coupling capacitance Cc can be included.

With this type of circuit implementation, the voltage ranges for the power supply voltage VDD and the external bias voltage VREF provided to the cascode output transistors are maximized. In regard to the power supply voltage VDD, the minimum voltage magnitude is the sum of one transistor input biasing voltage VGS (e.g., for transistor M5) and two transistor output operating voltages in saturation mode VDSAT (e.g., for transistors M1 and M2), or VGS+2*VDSAT. This maximum power supply voltage range ensures that transistors M1 and M2 operate in saturation. In regard to the cascode biasing voltage VREF, such biasing voltage VREF has a maximum magnitude equal to the power supply voltage VDD, and a minimum magnitude equal to the sum of one transistor input biasing voltage VGS (for transistor M2) and one transistor output operating voltage in saturation VDSAT (for transistor M1), or VGS+VDSAT. This maximum voltage range ensures that transistor M1 operates in saturation. Hence, by ensuring that transistors M1 and M2 operate in saturation, maximum DC voltage gain is ensured.

In conformance with the discussion herein, it will be appreciated and understood by one of ordinary skill in the art that a MOSFET current mirror circuit with a cascode output in accordance with the presently claimed invention can be implemented with a P-MOSFET current mirror circuit, N-MOSFET cascode output circuit and complementary MOSFET voltage biasing circuit as discussed herein, or alternatively, with an N-MOSFET current mirror circuit, P-MOSFET cascode output circuit and complementary MOSFET voltage biasing circuit with appropriate reversals in drain and source terminal connections and power supply voltage to provide an output current source rather than an output current sink circuit.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a metal oxide semiconductor field effect transistor (MOSFET) current mirror circuit with a cascode output, comprising:

first and second power supply terminals to convey a power supply voltage;

current and voltage source circuitry, coupled between said first and second power supply terminals, that responds to a received input current by providing a first bias voltage and a mirrored current proportional to said input current; and cascode circuitry, coupled between said first and second power supply terminals and to said current and voltage source circuitry, that responds to a received second bias voltage, said first bias voltage and said mirrored current by providing a cascode current proportional to said mirrored current;

wherein said power supply voltage has a magnitude with a minimum approximately equal to a sum of a transistor input biasing voltage and two transistor output operating voltages, and said second bias voltage has a magnitude with a maximum approximately equal to said power supply voltage magnitude and a minimum approximately equal to a sum of another transistor input biasing voltage and another transistor output operating voltage.

2. The apparatus of claim 1, wherein:

said transistor input biasing voltages comprise a gate-to-source terminal voltage; and said transistor output operating voltages comprise a drain-to-source terminal saturation voltage.

3. The apparatus of claim 1, wherein said current and voltage source circuitry comprises:

current mirror circuitry that responds to said received input current and a third bias voltage by providing said mirrored current; and voltage bias circuitry, coupled to said input current mirror circuitry, that responds to said received input current by providing said first and third bias voltages.

4. The apparatus of claim 3, wherein said first and third bias voltages have respective values that vary in mutually opposing directions.

5. The apparatus of claim 3, wherein:
said current mirror circuitry comprises mutually coupled first and second circuit branches;
said first circuit branch has an operating voltage proportional and responsive to said third bias voltage; and
said second circuit branch has another operating voltage substantially equal to said first circuit branch operating voltage.

6. The apparatus of claim 1, wherein said cascode circuitry comprises:
a first cascode circuit branch that receives said first and second bias voltages and said mirrored current; and
a second cascode circuit branch, coupled to said first cascode circuit branch, that receives said first and second bias voltages and provides said cascode current.

7. The apparatus of claim 1, wherein:
said current and voltage source circuitry comprises a first plurality of transistors of a first conductivity type; and
said cascode circuitry comprises a second plurality of transistors of a second conductivity type opposite said first conductivity type.

8. The apparatus of claim 7, wherein said current and voltage source circuitry further comprises at least one transistor of said second conductivity type.

9. An apparatus including a metal oxide semiconductor field effect transistor (MOSFET) current mirror circuit with a cascode output, comprising:
first and second power supply terminals to convey a power supply voltage;
current mirror circuitry, coupled between said first and second power supply terminals, that responds to a received input current and a received first bias voltage by providing a mirrored current proportional to said input current;
voltage source circuitry, coupled between said first and second power supply terminals and to said current mirror circuitry, that responds to said received input current by providing said first bias voltage and a second bias voltage; and
cascode circuitry, coupled between said first and second power supply terminals, to said current mirror circuitry and to said voltage source circuitry, that responds to a received third bias voltage, said second bias voltage and said mirrored current by providing a cascode current proportional to said mirrored current;
wherein said power supply voltage has a magnitude with a minimum approximately equal to a sum of a transistor input biasing voltage and two transistor output operating voltages, and said second bias voltage has a magnitude with a maximum approximately equal to said power supply voltage magnitude and a minimum approximately equal to a sum of another transistor input biasing voltage and another transistor output operating voltage.

10. The apparatus of claim 9, wherein:
said transistor input biasing voltages comprise a gate-to-source terminal voltage; and
said transistor output operating voltages comprise a drain-to-source terminal saturation voltage.

11. The apparatus of claim 9, wherein said first and second bias voltages have respective values that vary in mutually opposing directions.

12. The apparatus of claim 9, wherein:
said current mirror circuitry comprises mutually coupled first and second circuit branches;
said first circuit branch has an operating voltage proportional and responsive to said first bias voltage; and
said second circuit branch has another operating voltage substantially equal to said first circuit branch operating voltage.

13. The apparatus of claim 9, wherein said cascode circuitry comprises:
a first cascode circuit branch that receives said second and third bias voltages and said mirrored current; and
a second cascode circuit branch, coupled to said first cascode circuit branch, that receives said second and third bias voltages and provides said cascode current.

14. The apparatus of claim 9, wherein:
said current mirror circuitry comprises a first plurality of transistors of a first conductivity type;
said voltage source circuitry comprises a second plurality of transistors of said first conductivity type and a second conductivity type opposite said first conductivity type; and
said cascode circuitry comprises a third plurality of transistors of said second conductivity type.

15. An apparatus including a metal oxide semiconductor field effect transistor (MOSFET) current mirror circuit with a cascode output, comprising:
current and voltage sourcing means for receiving a power supply voltage and an input current and in response thereto generating a first bias voltage and a mirrored current proportional to said input current; and
cascode circuit means for receiving a second bias voltage, said first bias voltage and said mirrored current and in response thereto generating a cascode current proportional to said mirrored current;
wherein said power supply voltage has a magnitude with a minimum approximately equal to a sum of a transistor input biasing voltage and two transistor output operating voltages, and said second bias voltage has a magnitude with a maximum approximately equal to said power supply voltage magnitude and a minimum approximately equal to a sum of another transistor input biasing voltage and another transistor output operating voltage.

16. An apparatus including a metal oxide semiconductor field effect transistor (MOSFET) current mirror circuit with a cascode output, comprising:
current mirror means for receiving a power supply voltage, an input current and a first bias voltage and in response thereto generating a mirrored current proportional to said input current;
voltage sourcing means for receiving said power supply voltage and said input current and in response thereto generating said first bias voltage and a second bias voltage; and
cascode circuit means for receiving a third bias voltage, said second bias voltage and said mirrored current and in response thereto generating a cascode current proportional to said mirrored current;
wherein said power supply voltage has a magnitude with a minimum approximately equal to a sum of a transistor input biasing voltage and two transistor output operating voltages, and said second bias voltage has a magnitude with a maximum approximately equal to said power supply voltage magnitude and a minimum approximately equal to a sum of another transistor input biasing voltage and another transistor output operating voltage.

* * * * *